United States Patent
Chevallier et al.

[19]

[11] Patent Number: 5,825,231
[45] Date of Patent: *Oct. 20, 1998

[54] TRANSFORMER CIRCUIT, DOUBLE-BALANCED MIXER

[75] Inventors: Gilles Chevallier, Langune Sur Mer, France; Eduard F. Stikvoort, Eindhoven, Netherlands

[73] Assignee: U.S. Philips Corporation, New York, N.Y.

[ * ] Notice: The terminal 23 months of this patent has been disclaimed.

[21] Appl. No.: 110,038

[22] Filed: Aug. 20, 1993

[30] Foreign Application Priority Data

Aug. 26, 1992 [FR] France .................................. 92 10280

[51] Int. Cl.⁶ .......................................................... H03D 7/14
[52] U.S. Cl. ............................................. 327/356; 327/359
[58] Field of Search ................................. 328/156, 158, 328/160; 307/261, 262, 529, 490, 494, 513; 330/301, 254, 277, 278, 285; 327/105, 113, 116, 119, 355, 356, 359, 256, 257

[56] References Cited

U.S. PATENT DOCUMENTS

| | | | |
|---|---|---|---|
| 3,005,956 | 10/1961 | Grant | 330/301 |
| 3,474,345 | 10/1969 | Moses | 330/15 |
| 3,573,645 | 4/1971 | Franklin | 330/301 |
| 3,590,285 | 6/1971 | Hargrove | 307/262 |
| 3,671,773 | 6/1972 | Cardwell | 307/261 |
| 3,986,048 | 10/1976 | Okada et al. | 307/490 |
| 4,109,214 | 8/1978 | Morin | 330/254 |
| 4,216,431 | 8/1980 | Shibata et al. | 455/333 |
| 4,636,663 | 1/1987 | Jongepier et al. | 307/529 |
| 4,931,746 | 6/1990 | Tränkle et al. | 307/529 |
| 4,937,516 | 6/1990 | Sempel | 307/529 |
| 4,952,866 | 8/1990 | Van Tuijl | 307/261 |
| 4,956,615 | 9/1990 | Bohme et al. | 330/288 |

FOREIGN PATENT DOCUMENTS

| | | |
|---|---|---|
| 0131337 | 1/1985 | European Pat. Off. . |
| 0351639 | 1/1990 | European Pat. Off. . |
| 2839061 | 3/1979 | Germany . |

OTHER PUBLICATIONS

Search Report.

*Primary Examiner*—Timothy P. Callahan
*Assistant Examiner*—T. T. Lam
*Attorney, Agent, or Firm*—Edward Blocker

[57] ABSTRACT

An integratable transformer circuit for converting an asymmetrical input signal into a pair of symmetrical output signal currents and requiring only one IC connection pin. The circuit exhibits a low input impedance combined with good noise, gain and intermodulation performance up to high frequencies. The asymmetrical input terminal of the circuit is coupled to a node commonly coupled to the emitter of a common base transistor and to the base of a common emitter transistor. The common base transistor acts as a non-inverting current follower, the common emitter transistor as an inverting transimpedance amplifier. An input signal current is transferred to a first symmetrical output terminal via the node and the common base transistor, thereby producing a signal voltage at the node. This signal voltage modulates the collector current of the common emitter transistor, which is in phase opposition to the input signal current and is transferred to the second output terminal.

23 Claims, 7 Drawing Sheets

5,825,231

TRANSFORMER CIRCUIT, DOUBLE-BALANCED MIXER

BACKGROUND OF THE INVENTION

This invention relates to a transformer circuit for converting an asymmetrical input signal into a pair of substantially symmetrical output signal currents, comprising a first and a second transistor, the emitter of the first transistor being coupled to an asymmetrical input terminal, the collector of the first transistor and the collector of the second transistor being coupled to a first and to a second symmetrical output terminal, respectively.

The invention also relates to a double-balanced mixer circuit.

Such a transformer circuit is known from the European Patent Application number 84200975.5, where it is used as an input stage 100 in a double-balanced mixer circuit, as shown in FIG. 1. Its symmetrical output terminals SO1 and SO2 are coupled to the common emitter terminals 3 and 4 of the differential mixer transistor pairs T1, T2 and T3, T4, respectively.

In the known transformer circuit both the emitter of a first transistor T5 and a second transistor T6 are coupled to the asymmetrical input terminal AI via an inductive transformer 12. The inductive transformer converts the asymmetrical signal from signal source 10 into a pair of symmetrical signals at the emitters of transistors T5 and T6. Thus, the signals applied to the emitters of transistors T5 and T6 are in phase opposition. Since the bases of transistors T5 and T6 are connected to signal ground, these transistors constitute a symmetrical current follower. The pair of symmetrical signal currents at the emitters of these transistors is transferred with nearly unity gain as a pair symmetrical output signal currents at terminals SO1 and SO2.

Although the known transformer circuit is suitable to be used in a high performance receiver front-end, it inherently requires an inductive transformer to transform an asymmetrical input signal into a pair of symmetrical signals. Such an inductive transformer is relatively expensive and occupies a relatively large space. More and more receiver functions are integrated on a single chip to meet the demand for cheap and small size receivers, for example, in cordless telephony. The inductive transformer is unsuited to be integrated on a chip. Furthermore, at least two connection pins are required to couple the inductive transformer to the integrated components of the transformer circuit. The number of connection pins may increase and therewith the size and the price of the housing of the chip.

As such, transformer circuits are known that do not require an inductive transformer, for example, a long-tail pair input stage in a double-balanced mixer circuit as known from the German Offenlegungsschrift 28,39,061 which corresponds to U.S. Pat. No. 4,216,431 Aug. 5, 1980. However, the performance of the long-tail pair input stage is inferior to that of a transformer circuit comprising an inductive transformer as previously discussed. First of all, the long-tail pair input stage exhibits a worse noise and intermodulation behaviour, as explained in the aforementioned European Patent Application. Secondly, the long-tail pair input stage has a relatively high input impedance compared to the inductive transformer circuit. This makes the long-tail pair input stage more susceptible to interferences due to parasitic capacitive couplings of unwanted signal sources with the asymmetrical input terminal. Thirdly, the symmetry between the pair of output signal currents, applied at the common emitter terminals of the two pairs of mixer transistors, will in general be less than that of the known transformer circuit.

SUMMARY OF THE INVENTION

It, inter alia, an object of the invention to provide a transformer circuit for converting an asymmetrical input signal into a pair of substantially symmetrical output signal currents, which has a performance comparable to that of the known transformer circuit, comprising an inductive transformer but which is better suited to integration on a chip and which requires only one input connection pin and less voluminous and/or expensive external components.

To this end the transformer circuit is characterized in that the asymmetrical input terminal is coupled to a node commonly coupled to the emitter of the first transistor and to the base of the second transistor, the first and the second transistor being arranged in common base configuration and in common emitter configuration, respectively.

The invention is based on the recognition that a pair of symmetrical output signal currents can be obtained by directing an input current from the signal source to flow to the first symmetrical output terminal via the first transistor and that at least the signal voltage across the emitter-base junction of the first transistor should be used to drive the second transistor, which can provide a collector current that is substantially in phase opposition to the collector current of the first transistor. The first transistor is arranged in common base configuration and constitutes a non-inverting current follower, whereas the second transistor is arranged in common emitter configuration and constitutes an inverting transadmittance amplifier.

The input current from the signal source transferred to the node will substantially flow into the emitter of the first transistor since the input impedance of the current follower is relatively low. The signal voltage at the node results from a current-to-voltage conversion (transimpedance) due to the non-zero input impedance of the current follower. This signal voltage is applied at the base of the second transistor and modulates its collector current, which will be in phase opposition with that of the first transistor. The voltage-to-current conversion (transadmittance) by the second transistor can be made substantially inverse to that of the previously mentioned current-to-voltage conversion, such that the collector currents of the first and the second transistor are substantially symmetrical.

A preferred embodiment of the transformer circuit according to the invention is characterized in that a first impedance is arranged between the emitter of the first transistor and the node and that a second impedance is arranged between the emitter of the second transistor and signal ground. The addition of impedances in series with the emitters of the first and second transistors improves the large signal handling and/or the noise behaviour of the circuit.

A further preferred embodiment of the transformer circuit according to the invention is characterized in that an input stage is arranged between the asymmetrical input terminal and the node. The noise figure of this embodiment is comparable to that of the known transformer circuit and is mainly determined by the input stage. The input stage provides power gain, such that the noise contribution of the first and the second transistors with their respective emitter series impedances is relatively small compared to that of the input stage.

A further preferred embodiment of the transformer circuit according to the invention is characterized in that a cascode transistor in common base configuration is arranged between the collector of the second transistor and the second symmetrical output terminal. The cascode transistor may help to improve the symmetry of the pair of output signal currents by equalizing the collector-base voltage difference of the first and the second transistor, such that the so-called 'early effect' affects the signal transfer via both transistors to the same extent.

In order to improve the stability in biasing the transformer circuit according to the invention, an embodiment is preferably characterized in that a DC-blocking capacitor is arranged between the node and the base of the second transistor to decouple the bias voltage of the emitter of the first transistor from the bias voltage of the base of the second transistor.

Said improvement is alternatively achieved by another preferred embodiment of the transformer circuit according to the invention which is characterized in that it comprises a bias control loop comprising a first current sensing circuit coupled to the first transistor, a second current sensing circuit coupled to the second transistor and a difference detection circuit with a first and a second input coupled to the output of the first and the second current sensing circuit respectively. The output of the difference detection circuit is coupled to the base of the first transistor via at least one loop capacitor.

When the transformer circuit is equipped with such a bias control loop, it is possible to obtain stable biasing of the circuit without the use of said DC-blocking capacitor. This transformer circuit may advantageously be used when parasitic capacitances, introduced by said DC-blocking capacitor, give rise to an unacceptable asymmetry in the pair of output signal currents and/or when said DC-blocking capacitor requires too much chip-area.

A further preferred embodiment, based on the aforementioned embodiment of the transformer circuit according to the invention, is characterized in that a loop transistor is inserted between the output of the difference detection circuit and the base of the first transistor, the base-emitter junction of the loop transistor constituting said loop capacitor.

An embodiment of a double-balanced mixer circuit according to the invention comprises a first differential pair of first and second mixer transistors, whose emitters are coupled to a first common emitter terminal, a second differential pair of third and fourth mixer transistors, whose emitters are coupled to a second common emitter terminal, wherein the bases of the first and the fourth transistor and the bases of the second and the third transistor are coupled to a first common and a second common base terminal respectively, between which base terminals a mixing signal may be applied. This embodiment is characterised in that the asymmetrical input terminal is coupled to a node being commonly coupled to the first common emitter terminal and the base of a transistor, being arranged in a common emitter configuration, its collector coupled to the second common emitter terminal.

This embodiment of a double-balanced mixer circuit is particularly suited to operate at very low supply voltages (e.g. in 1 or 2 1.5 volt battery operated equipment) since the number of emitter-base junctions arranged in series between the supply voltage connections can be reduced to two. In this embodiment the first and the second mixer transistor fulfil the role of the first transistor in a transformer circuit according to the invention. The base of the first and the second mixer transistor are in general coupled to a low impedance signal source such that these transistors are arranged in a common base configuration and act as current followers. The portion of the current from the input signal source flowing through the first and through the second mixer transistor is determined by the voltage difference between their respective bases. However, the input impedance at the first common emitter terminal is the same as in the case where the first and the second mixer transistor were to be replaced by a single transistor in common base configuration. Consequently, the transimpedance of both aforementioned cases has the same magnitude, and the signal voltage at the node may therefore be used to drive the base of the second transistor.

BRIEF DESCRIPTION OF THE DRAWINGS

The invention will be described in detail with reference to the accompanying drawing which will help to clarify the invention, and in which.

DESCRIPTION OF THE PREFERRED EMBODIMENTS

Figure 2:
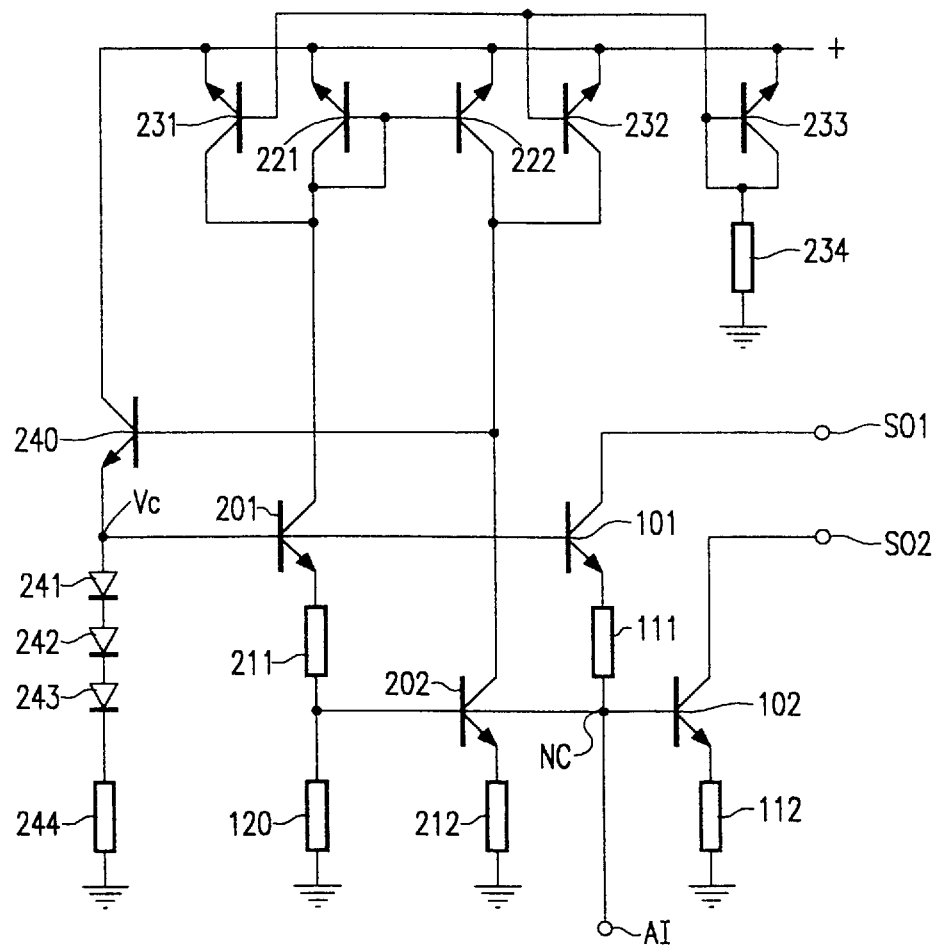
FIG. 2 is a first embodiment of a transformer circuit according to the invention.

FIG. 2 shows a first embodiment of a transformer circuit according to the invention and which is particularly suited for integration on a chip. The asymmetrical input terminal AI is directly coupled to the node NC. The node NC is commonly coupled to the emitter of a first transistor 101 via a first impedance 111 and to the base of a second transistor 102. Transistor 101 is effectively arranged in common base configuration, since the base of transistor 101 is coupled to signal ground via a relatively low impedance network constituted by diodes 241, 242 and 243 and impedance 244 connected in series. Transistor 102, whose emitter is coupled to signal ground via impedance 112, is arranged in common emitter configuration. The collectors of transistors 101 and 102 constitute the first and the second symmetrical output terminals (SO1, SO2) respectively, of the transformer circuit. The components whose reference numeral comprise a most significant decimal '2' and impedance 120 serve to correctly bias transistors 101 and 102, as will be discussed later.

Transistor 101 and impedance 111 can be regarded as a non-inverting current follower, its input terminal being node NC, its output terminal being terminal SO1. The input impedance of this current follower is approximately equal to the sum of impedance 111 and the emitter impedance of transistor 101. Transistor 102 and impedance 112 can be regarded as an inverting transadmittance amplifier, its input terminal being node NC too, and its output terminal being terminal SO2. The input impedance of this transadmittance amplifier is at least an order of magnitude higher than that of the current follower. Its transadmittance gain, that is the voltage-to-current conversion factor, is approximately equal to the inverse of the sum of impedance 112 and that of the emitter impedance of transistor 102.

The input current drawn from a signal source connected to the asymmetrical input terminal AI will substantially flow into the emitter of transistor 101, thus to the symmetrical output terminal SO2. This is because the magnitude of impedance 111 is relatively low compared to that of impedances 211 and 120, to avoid unnecessary signal loss. In fact, the impedance between the node and signal ground is at least an order of magnitude higher than the input impedance formed by the emitter of the first transistor 101. Hence, the input impedance of the transformer circuit is approximately equal to that of the current follower as indicated above. The signal voltage at node NC is approximately equal to the product of the input current and the input impedance of the current follower. This signal voltage is the input voltage of the transadmittance amplifier indicated above.

Good symmetry between the collector signal currents of transistor 101 and transistor 102 can be obtained if the product of transimpedance gain and the input impedance of the current follower approximates unity gain. Such is the case, for example, if there is little difference between the bias currents of transistors 101 and 102 and if there is little difference between the impedances 111 and 112. Some asymmetry may result from the impedance between the base of transistor 101 and signal ground being non-zero, the so-called 'imperfect' common base configuration. This asymmetry may be compensated by a decrement of the magnitude of impedance 111 with respect to that of impedance 112.

The linear operation of the transformer circuit can be understood by recognizing that the sum of the base-emitter junction voltages of transistors 101 and 102 is constant and equal to control voltage Vc. An input current from a signal source at terminal AI flowing into the emitter of transistor 101 modulates the base-emitter junction voltage of transistor 101. This current-to-voltage conversion exhibits a logarithmic characteristic and is therefore non-linear. Consequently, the base-emitter junction voltage of transistor 102 is modulated inversely and non-linearly since the sum of the junction voltages is constant. However, the relation between collector current and base-emitter junction voltage of transistor 102 is also logarithmic. Thus, the non-linear logarithmic current-to-voltage conversion (transistor 101) is compensated by the non-linear, exponential voltage-to-current conversion (transistor 102), such that the transfer of an input current at terminal AI to an inverse output current at terminal SO2 is substantially linear.

Impedances 111 and 112 have little influence on the linearity of the transformer circuit, but do increase the maximum allowable input voltage at terminal AI by reducing the input voltage to input current conversion factor. If impedance 111 and 112 were omitted, the conversion of an asymmetrical input signal into a pair of symmetrical output signal currents would still be substantially linear, provided the input voltage remains below the maximum allowable value.

To obtain a stable operation, such that, for example, the output signal currents at terminals SO1 and SO2 are substantially symmetrical over a wide temperature range, the transformer circuit shown in FIG. 2 is equipped with a bias control loop. This bias control loop adjusts the base bias voltage of transistor 101, which is control voltage Vc, to make the bias current of transistor 102 substantially equal to that of transistor 101. The bias current of transistor 101 is, inter alia, determined by the magnitude of impedance 120.

The bias control loop comprises a first and a second current sensing circuit formed by transistor 201 in series with impedance 211 and transistor 202 in series with impedance 212, respectively. The collector currents of transistors 201 and 202 are scaled replica's of the collector currents of transistor 101 respectively 102. The scaling factor depends on the ratio between the dimensions of transistors 201 and 202 with respect to transistors 101 and 102 and the ratio between the impedances 211 and 212 with respect to impedances 111 and 112. The collectors of transistors 201 and 202 are coupled to transistors 221 and 222, respectively. The latter transistors form a current mirror acting as a difference detection circuit. The collector current of transistor 201 is first mirrored, thus inverted, and summed with the collector current of transistor 202, to generate a difference current flowing into the base of transistor 240 and possible parasitic capacitances (not shown). The base-emitter junction capacitance of transistor 240 integrates, inter alia, the difference current into a control voltage Vc. The base-emitter junction capacitance increases with the size of the transistor 240, which is relatively large to sufficiently filter out high frequency components in the difference current. In that case a distinct filtering capacitor between the base connection of transistor 240 and signal ground is superfluous. Diodes 241, 242 and 243 and impedance 244 are used to correctly bias transistor 240. Preferably these diodes are schottky diodes to promote a temperature independent operation of the transformer circuit.

In a steady-state situation, the bias currents of transistors 101 and 102 will be substantially equal. The bias control loop is an integrating control loop that strives for zero error, that is: zero difference current. A difference between the collector currents of transistors 101 and 102 results in a non-zero difference current, that is integrated into a continuously changing control voltage Vc. The change in control voltage Vc corrects in turn the ratio of the collector currents of transistors 101 and 102 such that the difference current is reduced to zero. Then, the voltage Vc remains constant.

A change in control voltage Vc mainly affects the bias current of transistor 102 in the case where the voltage drop over impedance 112 is at least one order of magnitude less than the base-emitter voltage of transistor 102. The base-emitter voltage of transistor 102 varies only slightly as a function of the transistor bias current. Since the bias current of transistor 101 substantially flows through impedance 120, this bias current has to be approximately equal to the quotient of the base-emitter voltage of transistor 102 and the resistance of impedance 120. Thus, impedance 120 mainly determines the magnitude of the bias currents of transistors 101 and 102, which bias currents are kept in balance by the bias control loop adjusting the control voltage Vc to this end.

In order to guarantee start-up of the transformer circuit over a wide temperature range, a start-up circuit is added comprising transistors 231, 232 and 233 and impedance 234. Transistors 231 and 232 act as current sources, whose collectors deliver a pair of symmetrical bias currents generated for initial biasing.

An interesting feature of the embodiment described above is that good symmetry between the output signal currents is maintained at frequencies only a few times lower than the cut-off frequencies of the transistors used in the circuit. The emitter-base capacitances of transistors 101 and 102 affect the high frequency input signal transfer via these transistors to much the same extent. Unbalance of the output signal at high frequencies will mainly result from the collector-base capacitances of transistors 101 and 102. As transistor 102 is arranged in common emitter configuration and transistor 101 in common base configuration, the collector-base signal voltage of transistor 102 is larger than the collector-base signal voltage of transistor 101. This causes a somewhat larger current in the collector-base capacitance of transistor 102. This current flows from the collector to the internal base causing a signal voltage across the internal base resistance of transistor 102.

Figure 3:
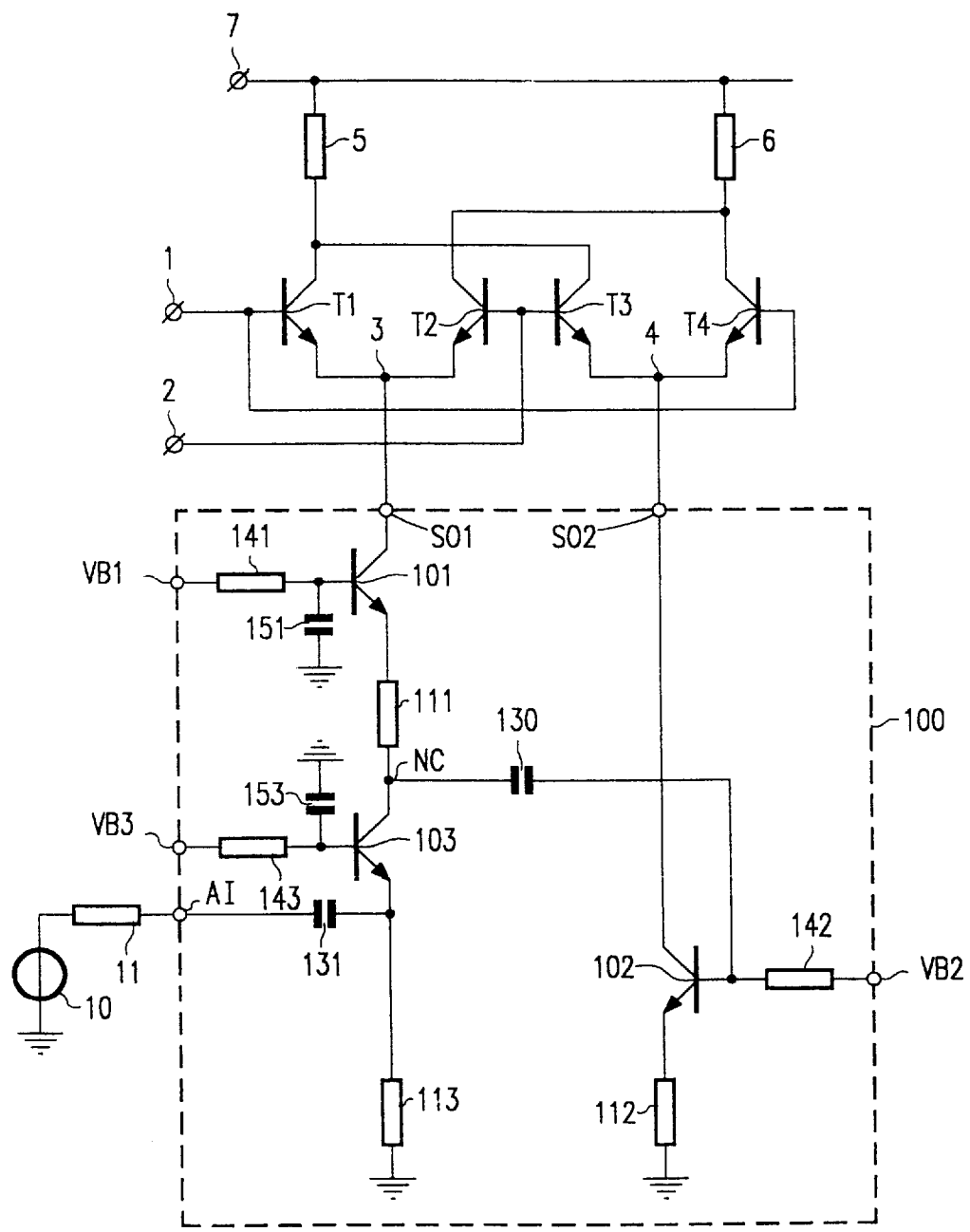
FIG. 3 is a double-balanced mixer circuit with a second embodiment of a transformer circuit according to the invention.

FIG. 3 shows a double-balanced mixer circuit comprising a second embodiment of a transformer circuit according to the invention. The symmetrical current outputs SO1 and SO2 of the transformer circuit 100 are connected to the common emitter terminals 3 and 4, respectively of the mixer transistors. Between the terminals 1 and 2 an oscillator signal may be applied such that the mixer transistors act as current switches. For example, when the voltage at terminal 1 is one base-emitter junction voltage higher than the voltage at terminal 2, mixer transistors T1 and T4 are conductive, whereas T2 and T3 are not. Then, the signals currents at SO1 and SO2 are directed to flow into impedance 5 and 6, respectively. Conversely, when the voltage at terminal 2 is higher than the voltage at terminal 1, mixer transistors T2 and T3 are conductive, whereas T1 and T4 are not. Then, the signals currents at SO1 and SO2 are directed to flow into impedance 6 and 5, respectively. Thus the current flowing into impedances 5 and 6 are alternately derived from SO1 and SO2.

A difference with respect to the embodiment shown in FIG. 2 is that the transformer circuit 100 of FIG. 3 has an input stage arranged between the asymmetrical input terminal AI and the node NC. This input stage comprises an input transistor 103 arranged in common base configuration and acting as a current follower. A further difference is that a DC blocking capacitor 130 is arranged between the node NC and the base of transistor 102. The embodiment of FIG. 3 does not require a bias control loop for stable operation. Bias voltages are supplied to terminals VB1, VB2 and VB3, which are further supplied to the bases of transistors 101, 102 and 103 via impedances 141, 142 and 143, respectively. The bases of transistors 101 and 103 are coupled to ground by capacitors 151 and 153, respectively. Thus, transistors 101 and 103 are arranged in common base configuration. Impedance 113 acts as a passive current source and determines, inter alia, the bias current of transistors 101 and 103. Capacitor 131 is a DC-blocking capacitor to decouple the emitter bias voltage of transistor 103 from the DC voltage applied at the asymmetrical input terminal AI.

The signal source voltage 10 is converted into a signal current at terminal AI, which substantially flows to the symmetrical output terminal SO1 via transistors 101 and 103. The conversion factor, inter alia, determined by the source impedance 11 and the emitter impedance of transistor 103. Preferably, the magnitude of impedance 113 is some orders of magnitude larger than that of the emitter impedance of transistor 103, such that most of the current from signal source 10 flows into the emitter of transistor 103. The signal current transferred via transistor 103 with nearly unity gain is converted into a signal voltage at the node NC. The current-to-voltage conversion factor, inter alia, determined by the impedance 111 and the emitter impedance of transistor 101.

The signal voltage at the node NC is supplied to the base of transistor 102 via a bidirectional current path that includes the DC-blocking capacitor 130, which constitutes a high-pass network together with impedance 142. Transistor 102 and impedance 112 constitute an inverting transadmittance amplifier supplying a signal current to output SO2 which is phase opposed to the signal current at terminal SO1.

The embodiment of FIG. 3 has some features worth while noting. First of all the noise performance of this embodiment can be superior to that of the embodiment shown in FIG. 2. This feature relates to the fact that the transfer from the asymmetrical input terminal AI to the node NC, may exhibit a voltage gain. This voltage gain depends, inter alia, on the magnitude of impedance 111. As the voltage gain increases, the noise figure of the transformer circuit shown in FIG. 3 decreases, since the contribution of the noise voltage of transistors 101 and 102 diminishes. With sufficient voltage gain, the noise voltage of transistors 101 and 102 may become negligible, such that the noise voltage of only one transistor (103) dominates. This is in contrast to the embodiment of FIG. 2 where both transistors 101 and 102 equally contribute to the noise voltage at the input terminal AI since they are both effectively arranged in series with this terminal.

As the frequency increases, the maximum obtainable voltage gain in the embodiment shown in FIG. 3 diminishes and consequently the noise figure will deteriorate. At a frequency which is an order of magnitude less than the cut-off frequency of the transistor 103, the noise figure of the embodiment shown in FIG. 2 may be superior to the one shown in FIG. 3. In the transformer circuit shown in FIG. 2, two transistors (101,102) have dominant noise contribution, whereas in the embodiment of FIG. 3 three transistors may contribute to the noise of the transformer circuit. Thus, with relatively low frequency input signals, an embodiment comprising an input stage as shown in FIG. 3 may be preferred and with relatively high frequency input signals, an embodiment without an input stage, as shown in FIG. 2, may be preferred.

A second interesting feature of the transformer circuit as shown in FIG. 3 is that a higher gain may be obtained compared to the known transformer circuit when both circuits have similar performance with respect to noise, linearity and current consumption. Gain is defined as the conversion factor of an asymmetrical input signal source voltage to a pair of symmetrical output signal currents. The gain of both the known transformer circuit and that of one according to the invention is, inter alia, determined by the magnitude of the sum of the source impedance 11 and the input impedance at the asymmetrical input terminal AI of the transformer circuit.

Figure 1:
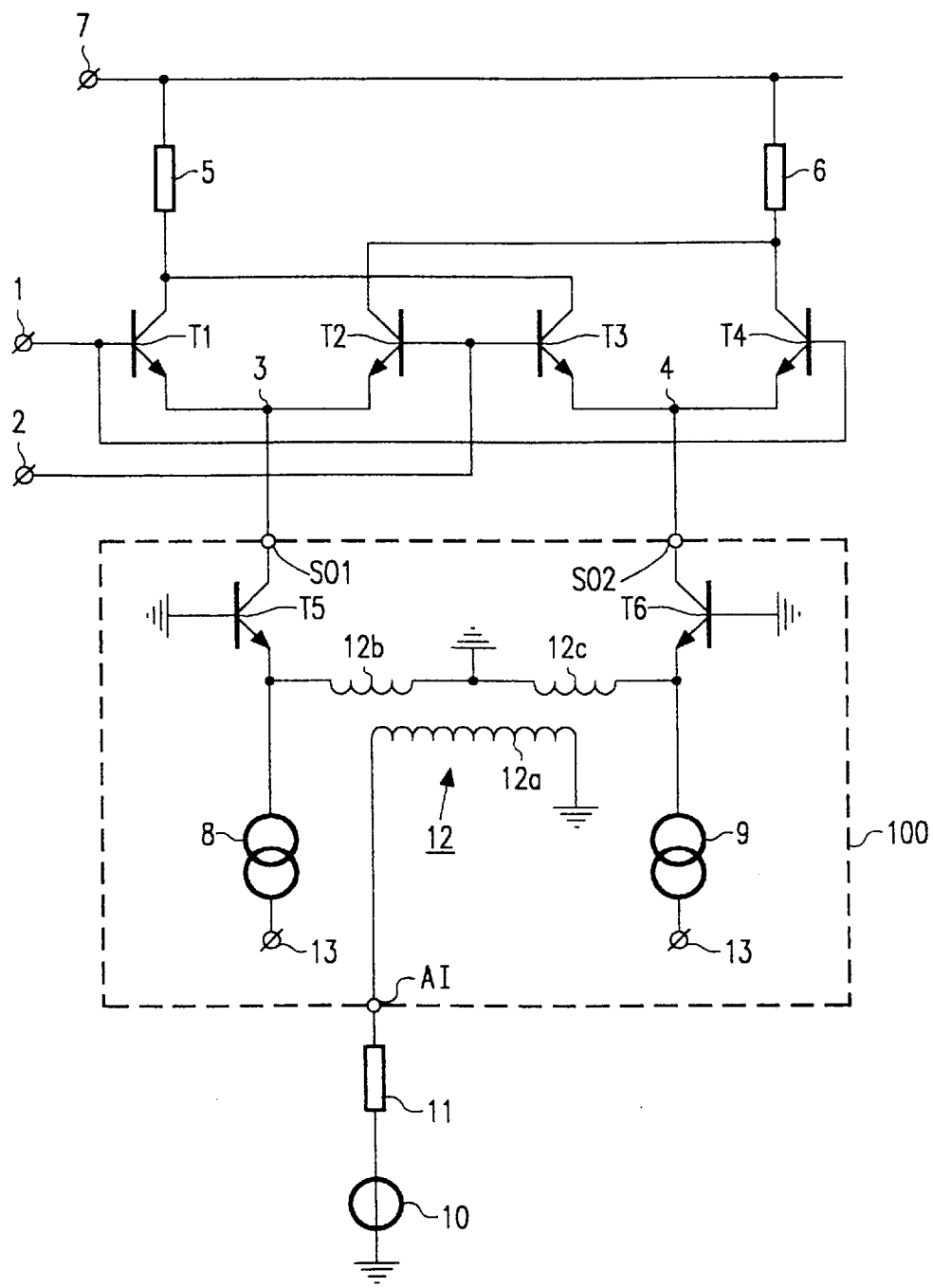
FIG. 1 is a double-balanced mixer circuit with a conventional transformer circuit as an input stage.

As an illustration of said feature, assume the bias currents of transistors T5 and T6 in circuit of FIG. 1 and transistors 101, 102 and 103 in the circuit of FIG. 3 to be 1 milliAmpere. This limits symmetrical output signal currents at SO1, SO2 of both circuits to a peak value of 1 milliAmpere. The input impedance at the asymmetrical input terminal AI of the transformer circuit in FIG. 3 will be approximately 25 Ohms, the emitter impedance of a typical silicon bipolar transistor biased at 1 milliampere. The impedance at terminal AI of the transformer circuit in FIG. 1 will be approximately 2 times 25 Ohms, if the transformation ratio of transformer 1 in FIG. 1 is 1:1. This is because the emitter impedance of transistors T5 and T6 are effectively arranged in series. Due to the higher input impedance of the known transformer circuit in this example, its gain will be less. Changing the transformer transformation ratio will either further reduce the gain or deteriorate the linearity and noise performance of the circuit.

Figure 4:
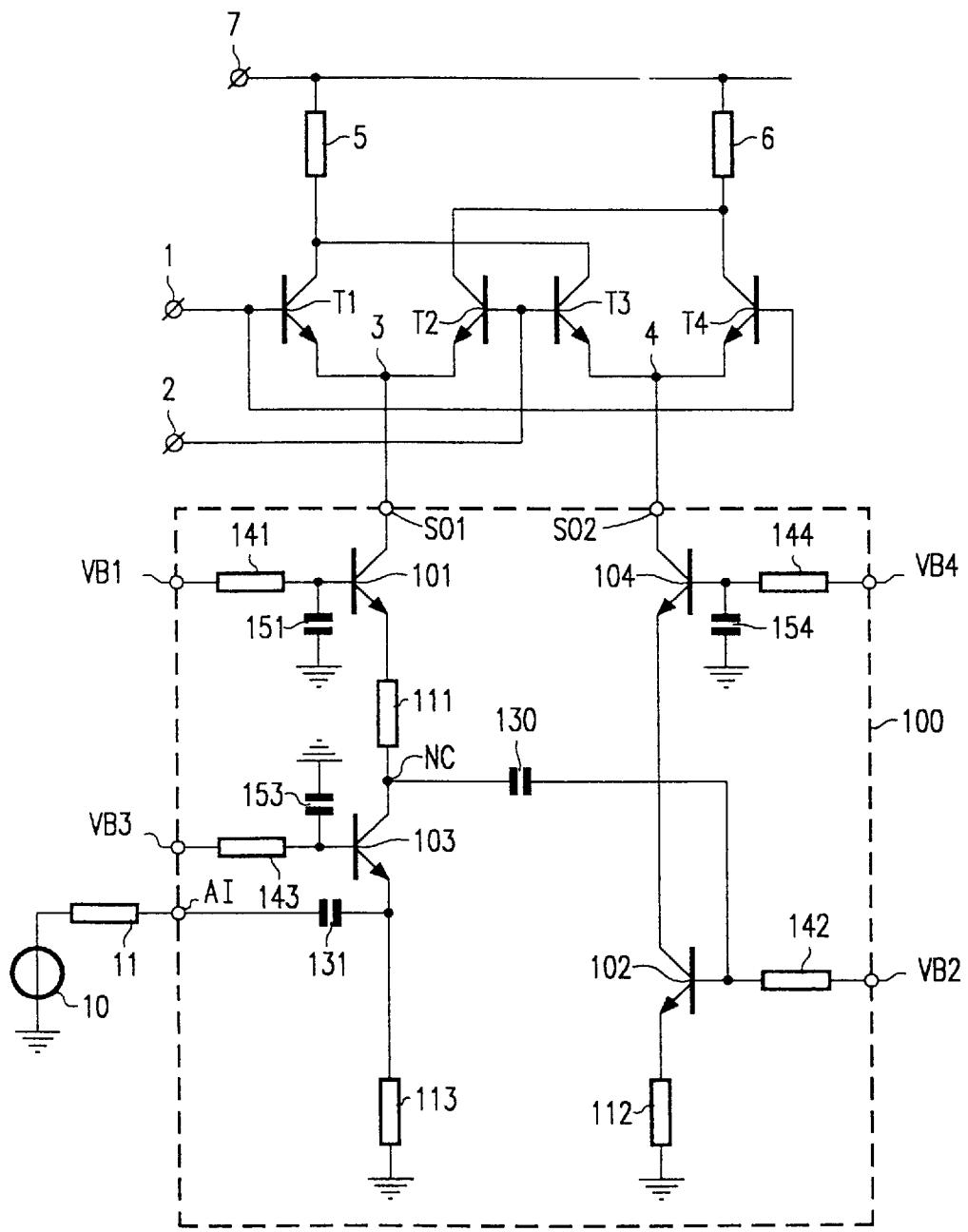
FIG. 4 is a double-balanced mixer circuit with a third embodiment of a transformer circuit according to the invention.

The double-balanced mixer circuit shown in FIG. 4 comprises a third embodiment of a transformer circuit according to the invention. Different from the second embodiment of FIG. 3, the transformer circuit 100 of FIG. 4 comprises a so-called cascode transistor 104, which is arranged between the collector of transistor 102 and the symmetrical output terminal SO2. This cascode transistor acts as a signal current follower, since it is arranged in common base configuration, by coupling its base to signal ground via capacitor 154. Cascode transistor 104 receives at its base a bias voltage applied at terminal VB4 via impedance 144.

A cascode transistor arranged in series with the second transistor, as shown in FIG. 4, may help to improve the symmetry between the output currents at terminals SO1 and SO2. In the embodiment of FIG. 4, the collector bias voltage of transistor 102 is independent of the collector bias voltage of transistor 101, determined by the voltages applied at terminals 1 and 2. In contrast with the embodiment of FIG. 3, the collector bias voltage of transistor 102 can be adjusted by mean of the bias voltage applied at terminal VB4, which is an additional parameter to reduce asymmetry between the output signal currents. Asymmetry may be caused by the so-called 'Early-effect' of the transistors, which is, inter alia, determined by the voltage across the collector-base junction. The influence of the Early effect on the output signal currents at SO1 and SO2 can be balanced by adjusting the bias voltage applied at terminal VB4.

Figure 5:
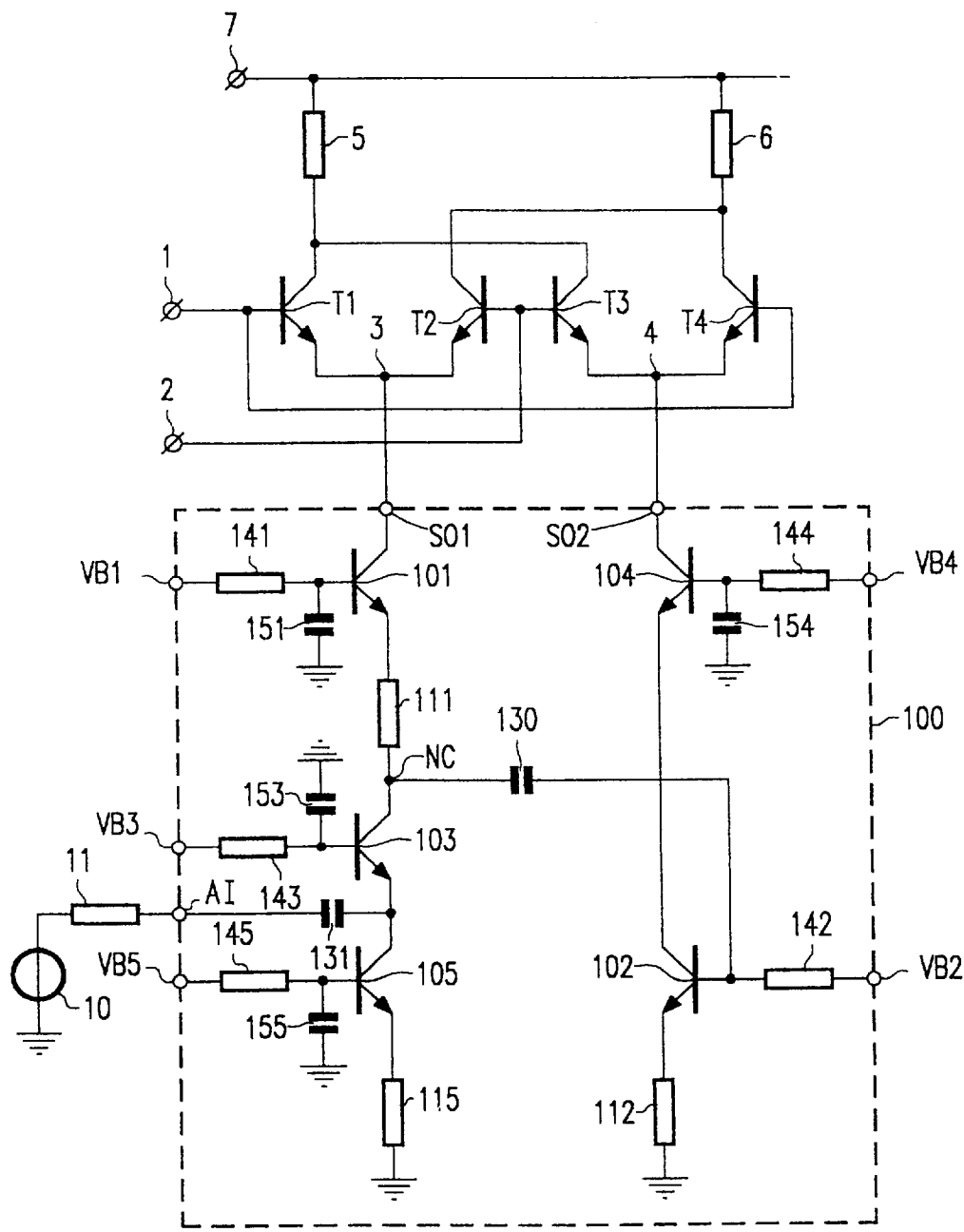
FIG. 5 is a double-balanced mixer circuit with a fourth embodiment of a transformer circuit according to the invention.

FIG. 5 shows a double-balanced mixer circuit comprising a fourth embodiment of a transformer circuit according to the invention. Compared to the third embodiment shown in FIG. 4, the passive current source for biasing transistors 101 and 103, that is impedance 113 in FIG. 4, is replaced in FIG. 5 by an active current source comprising transistor 105 and impedance 115. The bias current from this active current source is determined by the value of impedance 115 and the bias voltage applied at terminal VB5 which is then applied to the base of transistor 105 via impedance 145. The base is decoupled to ground via capacitor 155, inter alia, to prevent possible parasitic high frequency components on the bias voltage applied at terminal VB5 from parasitically modulating the active current source.

The embodiment shown in FIG. 5 offers the advantage that, due to the high collector impedance of transistor 105, almost all of the input signal current at terminal AI is directed to flow into the emitter of transistor 103. The gain of the transformer circuit presented in FIG. 5 may therefore be higher than that of FIG. 4, especially when the circuits are to operate at low supply voltages. To enable low voltage operation, the DC resistance value of impedance 113 is to be kept small to limit the voltage drop across its terminals. The magnitude of the impedance 113 (FIG. 4) at input signal frequencies could be enlarged using an inductor. However, only small inductances can be integrated on a chip. Thus, the magnitude of the collector impedance of transistor 115 in FIG. 5 will generally be higher than that of impedance 113 in FIG. 4.

Figure 6:
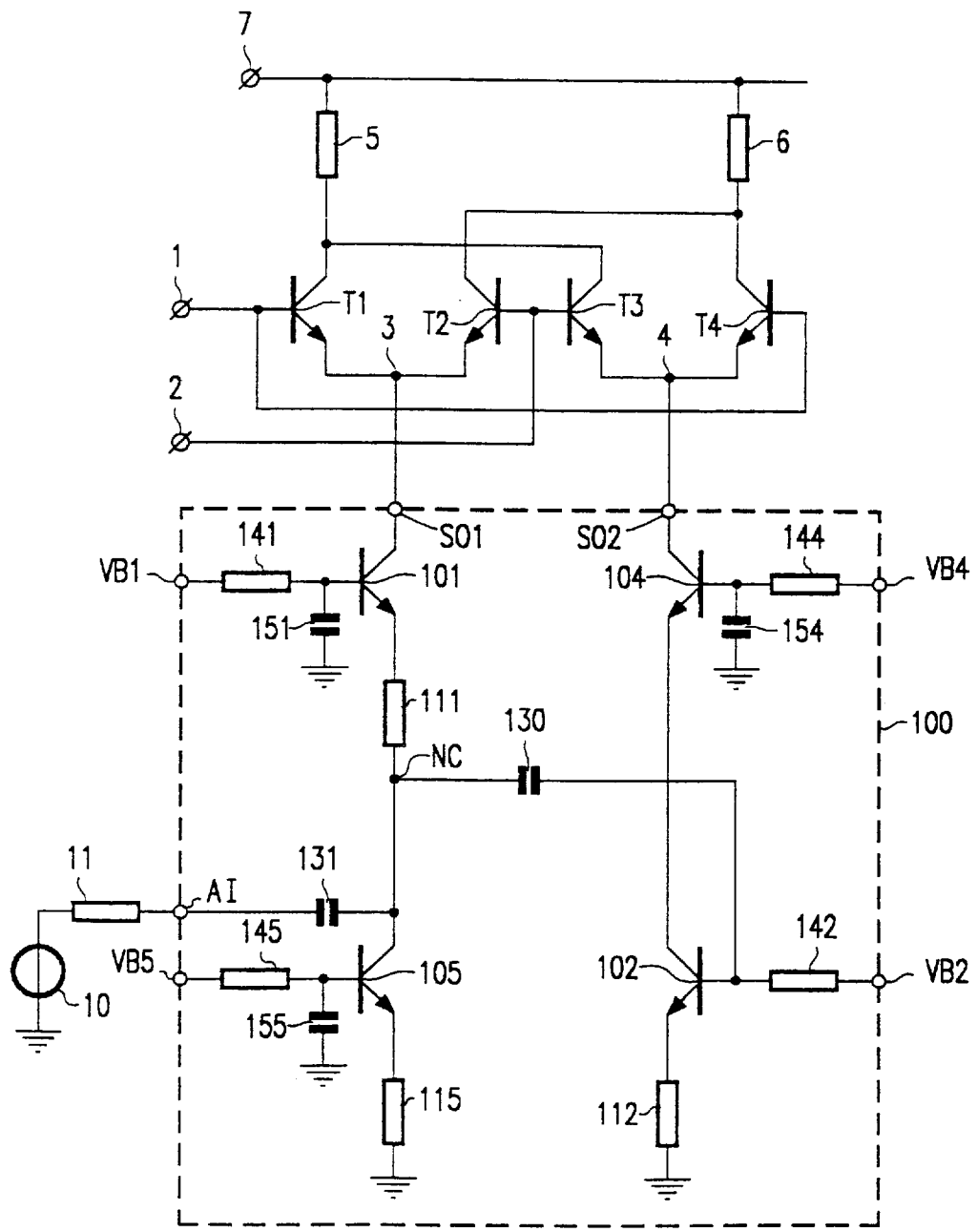
FIG. 6 is a double-balanced mixer circuit with a fifth embodiment of a transformer circuit according to the invention.

FIG. 6 shows a double-balanced mixer circuit comprising a fifth embodiment of a transformer circuit according to the invention. In this embodiment, the input transistor 103 and its associated elements (impedance 143, capacitor 153 and terminal VB3) shown in FIG. 5 are omitted. Thus, the asymmetrical input terminal AI is coupled to the node NC via passive elements only. A similar case is shown in FIG. 2, of which of embodiment also does not comprise an input transistor between the terminal AI and the node NC.

Omitting the input transistor 103 shown in FIG. 5 may be an option if the circuit is to operate at relatively low supply voltages. However, this may have a detrimental effect on the noise performance at relatively low frequencies since there is no longer a voltage gain between the terminal AI and the node NC. To obtain the same gain at the same current consumption with respect to the embodiment shown in FIG. 5, impedances 111 and 112 of the embodiment shown in FIG. 6 may be omitted too (not shown).

Figure 7:
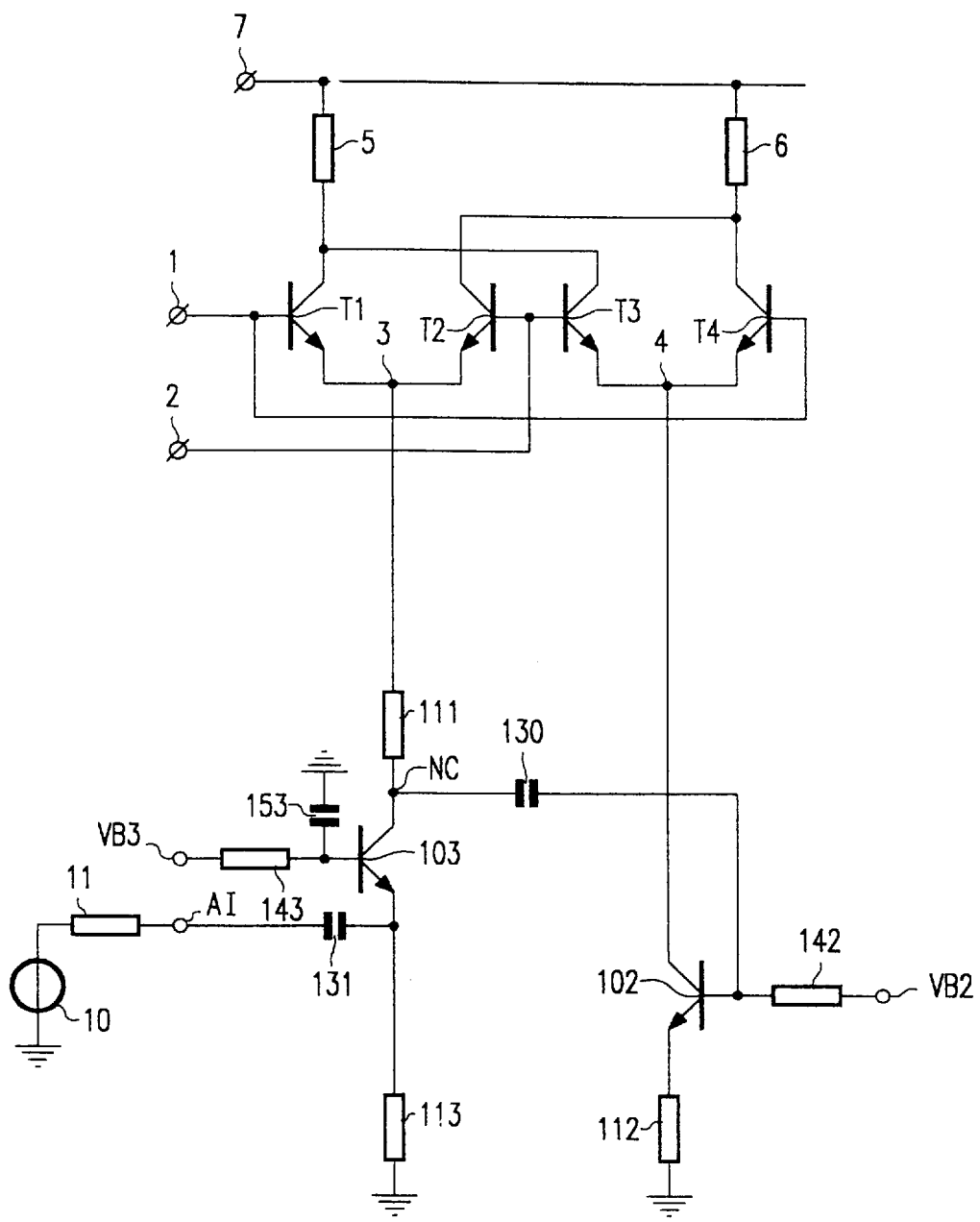
FIG. 7 is an embodiment of a double-balanced mixer circuit according to the invention.

A double-balanced mixer circuit according to the invention, very well suited to operate at relatively low supply voltages, is shown in FIG. 7. Compared to FIG. 3, transistor 101 and its associated elements (impedance 141, capacitor 151 and terminal VB1) have been omitted. The gist of the circuit shown in FIG. 7 is that mixer transistors T1 and T2 can take over the function of transistor 101. In practice terminals 1 and 2 are coupled to an oscillator signal source, whose source impedance is relatively low, such that mixer transistors T1 and T2 are effectively arranged in common base configuration. The impedance at the common emitter terminal 3 is practically equal to the emitter impedance of transistor 101 in FIG. 3, assuming that transistor 103 of FIG. 3 and transistor 103 of FIG. 7 are biased at the same current. Thus, the signal current from the signal source 10 will substantially flow to common emitter terminal 3 via transistor 103 and produce a signal voltage at the node NC. This signal voltage can be used to drive transistor 102 such that its collector current and the current flowing to common emitter terminal 3 are substantially symmetrical.

Although the double-balanced mixer circuit presented in FIG. 7 can operate at lower supply voltages than the circuits of FIGS. 3 to 6, it may exhibit a higher level of spurious signals at the asymmetrical input terminal AI and in the mixer output voltages across impedances 5 and 6 respectively. Such spurious signals originate from an oscillator signal applied at terminals 1 and 2, producing a residual signal at the common emitter terminals 3 and 4, substantially composed of the second harmonic of the oscillator signal. In the circuits shown in FIGS. 3 to 6, transistor 101 is arranged between the common emitter terminal 3 and the node NC. Transistor 101 prevents, to a large extent, a cross-talk of the residual signal at the common emitter terminal 3 to the node NC. In the circuit shown in FIG. 7, however, there will be little cross-talk attenuation of the residual signal to the node NC. Such an unwanted residual signal at node NC may further the cross-talk to the asymmetrical input terminal AI. Moreover, it also modulates the collector current of transistor 102 and consequently produces a parasitic component in the mixer output voltage.

While 6 embodiments are shown and described to clarify the invention, a person skilled in the art may conceive many other alternative embodiments of a transformer circuit or a double-balanced mixer circuit without departing from the spirit and the scope of the invention claimed. The circuitry to bias the first and the second transistor may differ from that in the embodiments as described. Passive current sources, for example, impedance 113, or active current sources, for example, transistor 105 and impedance 115, may be used alternatively. Cascode transistors may be arranged between the collector of the first transistor and the first symmetrical output terminal, as well as additional cascode transistors between the collector of the second transistor and the second symmetrical output terminal. Alternative input stages can be arranged between the asymmetrical input terminal AI and the node NC.

Wherever in the text a circuit element is designated as 'impedance', it is to be understood that this element may be resistive and/or inductive. For example, impedances 111 and 112 as shown in FIGS. 2 to 7 may comprise integrated inductors, to improve the high frequency noise behaviour of the circuit. Impedance 113 in FIGS. 3, 4 and 7 could be an inductor, being an external component arranged between the input pin of an integrated transformer circuit and signal ground. In this case capacitor 131 would also be an external component. Thus, it will be evident that, although the transformer circuit is very well suited for integration on a chip, not all of its elements need to be integrated.

Furthermore, having knowledge of the invention, it will be obvious to a person skilled in the art that the effectiveness of the invention does not rely on the use of bipolar NPN transistors as shown in the embodiments. Alternatively, field-effect transistors may be used, in which case emitter, collector and base in the present Application should read: source, drain and gate, respectively. Furthermore, it will be evident that the polarity of the transistor not ciritical. Instead of a bipolar NPN or N-channel field effect transistor, PNP or P-channel field-effect transistors may be used.

In a double-balanced mixer circuit, the symmetrical output terminals (SO1, SO2) of the transformer circuit need not be directly coupled to the common emitter terminals (3, 4) of the differential mixer transistor pairs. For example, DC-blocking capacitors may be arranged between the symmetrical output terminals and the common emitter terminals in order to bias the differential mixer transistor pairs independently from the transformer circuit.

The application of a transformer circuit according to the invention is not limited to double-balanced mixer circuits. It can also be applied advantageously in other types of circuitry where the conversion of an asymmetrical signal into a pair of symmetrical signals is required. For example, in automatic gain control (AGC) amplifiers comprising two differential pairs as balanced voltage controlled current attenuators.

We claim:

1. Transformer circuit for converting an asymmetrical input signal into a pair of substantially symmetrical output signal currents, comprising a first and a second transistor, the emitter of the first transistor being coupled to an asymmetrical input terminal, the collector of the first transistor and the collector of the second transistor being coupled to a first and to a second symmetrical output terminal, respectively, wherein the asymmetrical input terminal is coupled to a node commonly coupled to the emitter of the first transistor and to the base of the second transistor, said node being connected to a point of reference voltage via a bidirectional current path, and wherein the first and the second transistor are connected in common base configuration and in common emitter configuration, respectively.

2. The transformer circuit according to claim 1, wherein a cascode transistor in common base configuration is coupled between the collector of the second transistor and the second symmetrical output terminal.

3. The transformer circuit according to claim 1 further comprising an input transistor coupled between the asymmetrical input terminal and the node and having a control electrode coupled to a reference voltage.

4. The transformer circuit according to claim 1, wherein said bidirectional current path includes a DC-blocking capacitor coupled between the node and the base of the second transistor.

5. Transformer circuit according to claim 1, which further comprises a bias control loop comprising a first current sensing circuit coupled to the first transistor, a second current sensing circuit coupled to the second transistor, a difference detection circuit having a first and a second input coupled to respective outputs of the first and the second current sensing circuit, the output of the difference detection circuit being coupled to the base of the first transistor via at least one loop capacitor.

6. Transformer circuit according to claim 5, wherein a loop transistor is coupled between the output of the difference detection circuit and the base of the first transistor, a base-emitter junction of the loop transistor constituting said loop capacitor.

7. Transformer circuit according to claim 2, wherein a first impedance is coupled between the emitter of the first transistor and the node and a second impedance is coupled between the emitter of the second transistor and signal ground.

8. The transformer circuit according to claim 2, wherein said bidirectional current path includes a DC blocking capacitor coupled between the node and the base of the second transistor.

9. The transformer circuit according to claim 1 wherein a first impedance is coupled between the emitter of the first transistor and said node and a second impedance is coupled between the emitter of the second transistor and signal ground.

10. The transformer circuit according to claim 1 further comprising circuit means coupled to said first and second transistors so as to maintain bias currents of said transistors substantially equal.

11. A double-balanced mixer circuit comprising: a first differential pair of first and second mixer transistors, whose emitters are coupled to a first common emitter terminal, a second differential pair of third and fourth mixer transistors, whose emitters are coupled to a second common emitter terminal, bases of the first and the fourth transistor and bases of the second and the third transistor being coupled to a first common and a second common base terminal respectively, for receiving a mixing signal, wherein an asymmetrical input terminal is coupled to a node coupled to the first common emitter terminal and to the base of a transistor connected in a common emitter configuration and having its collector coupled to the second common emitter terminal, wherein said node is coupled to the first common emitter terminal via a further transistor connected in common base configuration with its emitter coupled to the node and its collector coupled to the first common emitter terminal and said node is connected to a point of reference voltage via circuit means that provide an impedance between the node and point of reference voltage which is at least an order or magnitude higher than the input impedance of the emitter of the further transistor whereby a signal current received at the asymmetrical input terminal flows substantially and continuously to the first common emitter terminal via the emitter of said further transistor.

12. The double-balanced mixer circuit according to claim 11 wherein said node is coupled to the base of said transistor via a capacitor.

13. A transformer circuit comprising: an asymmetrical input terminal, a first and a second symmetrical output terminal at which is derived a pair of symmetrical output signals, a first transistor in common base configuration whose collector is coupled to said first symmetrical output terminal, a second transistor in common emitter configuration whose collector is coupled to said second symmetrical output terminal, a node commonly coupled to the emitter of the first transistor, to the base of the second transistor, to said asymmetrical input terminal and to signal ground via circuit means providing an impedance between the node and signal ground which is at least an order of magnitude higher than an input impedance formed by the emitter of the first transistor, the circuit means being coupled so as to direct a signal current received at said asymmetrical input terminal to substantially flow to the first symmetrical output terminal via the emitter of said first transistor.

14. A transformer circuit according to claim 13 wherein the circuit means further comprises a third transistor having a collector which is coupled to the emitter of the first transistor via a first impedance and which collector is coupled to the base of the second transistor, said asymmetrical input terminal being coupled to the emitter of said third transistor, and means coupling the base of said third transistor to a reference voltage terminal.

15. The transformer circuit according to claim 13, further comprising a DC blocking capacitor coupled between said node and the base of the second transistor.

16. The transformer circuit according to claim 13, wherein the circuit means further comprises a bias control loop having:

current sensing means for providing a scaled replica of the collector current of the first transistor and that of the collector current of the second transistor, respectively;

difference detection means for providing a difference current proportional to the difference between the scaled replica currents; and feedback means for supplying said difference current to the base of the first transistor.

17. The transformer circuit according to claim 13 wherein a first impedance is coupled between the emitter of the first transistor and said node and a second impedance is coupled between the emitter of the second transistor and signal ground.

18. The transformer circuit according to claim 17 wherein said circuit means includes an input transistor which is coupled between the asymmetrical input terminal and said node, said input transistor having a control electrode coupled to signal ground.

19. The transformer circuit according to claim 13, wherein a cascode transistor in common base configuration is coupled between the collector of the second transistor and the second symmetrical output terminal.

20. The transformer circuit according to claim 16, wherein said feedback means comprise a loop transistor having a base-emitter junction that constitutes a loop capacitor.

21. A double-balanced mixer circuit comprising: a first differential pair of first and second mixer transistors, whose emitters are coupled to a common first emitter terminal, a second differential pair of third and fourth mixer transistors, whose emitters are coupled to a common second emitter terminal, bases of the first and the fourth transistor and bases of the second and the third transistor being coupled to a common first and a common second base terminal, respectively, which in operation receive a mixing signal, wherein the first common emitter terminal and the second common emitter terminal are coupled to the first symmetrical output terminal and the second symmetrical output terminal, respectively, of the transformer circuit according to claim 13.

22. A double-balanced mixer circuit comprising: a first differential pair of first and second mixer transistors, whose emitters are coupled to a first common emitter terminal, a second differential pair of third and fourth mixer transistors, whose emitters are coupled to a second common emitter terminal, bases of the first and the fourth transistor and bases of the second and the third transistor being coupled to a first common and a second common base terminal respectively, for receiving a mixing signal, wherein an asymmetrical input terminal is coupled to a node coupled to the first common emitter terminal and to the base of a transistor connected in a common emitter configuration and having its collector coupled to the second common emitter terminal, wherein said node is coupled to the first common emitter terminal via a further transistor connected in common base configuration with its emitter coupled to the node and its collector coupled to the first common emitter terminal, and further comprising an input transistor coupled between the asymmetrical input terminal and the node and having a control electrode coupled to a reference voltage.

23. A double-balanced mixer circuit comprising: a first differential pair of first and second mixer transistors, whose emitters are coupled to a first common emitter terminal, a second differential pair of third and fourth mixer transistors, whose emitters are coupled to a second common emitter terminal, bases of the first and the fourth transistor and bases of the second and the third transistor being coupled to a first common and a second common base terminal respectively, for receiving a mixing signal, wherein an asymmetrical input terminal is coupled to a node coupled to the first common emitter terminal and to the base of a transistor connected in a common emitter configuration and having its collector coupled to the second common emitter terminal, wherein said node is coupled to the first common emitter terminal via a further transistor connected in common base configuration with its emitter coupled to the node and its collector coupled to the first common emitter terminal, and further comprising a cascode transistor in common base configuration coupled between the collector of said transistor and the second common emitter terminal.

* * * * *